United States Patent [19]

Matsuno

[11] Patent Number: 4,857,830
[45] Date of Patent: Aug. 15, 1989

[54] METHOD FOR MEASURING INSULATION RESISTANCE OF ELECTRIC LINE

[75] Inventor: Tatsuji Matsuno, Kanagawa, Japan

[73] Assignee: Toyo Communication Equipment Co., Ltd., Tokyo, Japan

[21] Appl. No.: 266,695

[22] Filed: Nov. 3, 1988

[51] Int. Cl.[4] .................. G01R 31/00; G01R 31/12
[52] U.S. Cl. ............................ 324/62; 324/509; 324/544; 324/551
[58] Field of Search ............ 324/509, 521, 522, 527, 324/539, 541, 544, 62, 57 R, 525, 551

[56] References Cited

U.S. PATENT DOCUMENTS

| | | | |
|---|---|---|---|
| 4,200,835 | 4/1980 | Anahara et al. | 324/541 X |
| 4,422,034 | 12/1983 | Matsuno et al. | 324/541 |
| 4,472,676 | 9/1984 | Eichmann et al. | 324/509 |
| 4,638,242 | 1/1987 | Matsuno | 324/551 |
| 4,791,375 | 12/1988 | Kan | 324/522 X |

FOREIGN PATENT DOCUMENTS

| | | | |
|---|---|---|---|
| 0010666 | 1/1983 | Japan | 324/521 |
| 0186765 | 9/1985 | Japan | 324/551 |
| 0043572 | 2/1987 | Japan | 324/551 |

Primary Examiner—Reinhard J. Eisenzopf
Assistant Examiner—Jack B. Harvey
Attorney, Agent, or Firm—Spensley Horn Jubas & Lubitz

[57] ABSTRACT

A method of measuring an insulation resistance of an electric line. An AC signal voltage having a frequency of $f_i$ is applied to the electric line through a voltage transformer or a current transformer coupled to a grounding conductor or to the electric line. Phase measuring currents having frequencies $(f_1 - f_S)$ and $(f_1 + f_S)$ are also applied to the electric line through a winding of the current transformer or voltage transformer. A leakage current component and the AC signal voltage are synchronously detected to obtain a synchronously detected output and the phase of the AC signal voltage of the frequency $f_1$ necessary for the synchronous detection is automatically adjusted so that a component of the synchronously detected output having a frequency $f_S$ becomes zero.

2 Claims, 5 Drawing Sheets

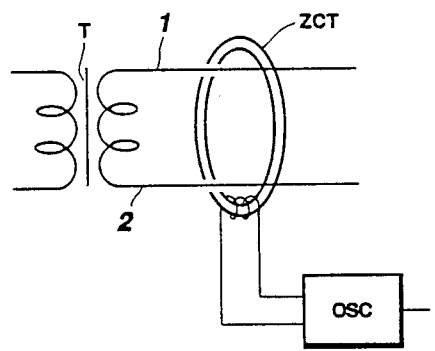
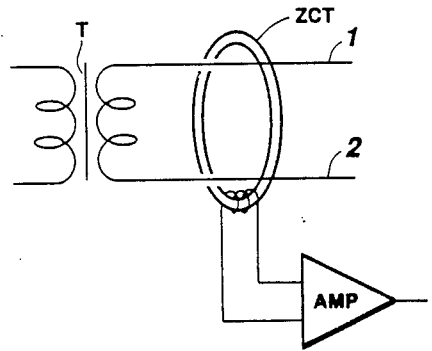
FIG.7(a)    FIG.7(b)
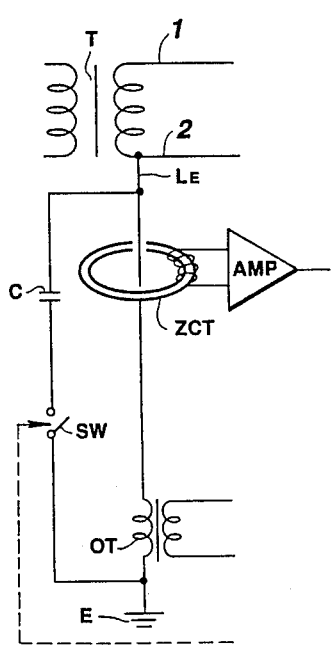
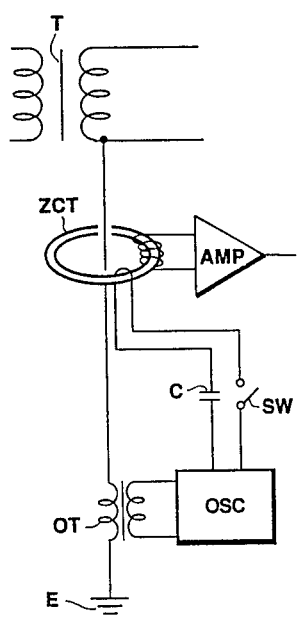
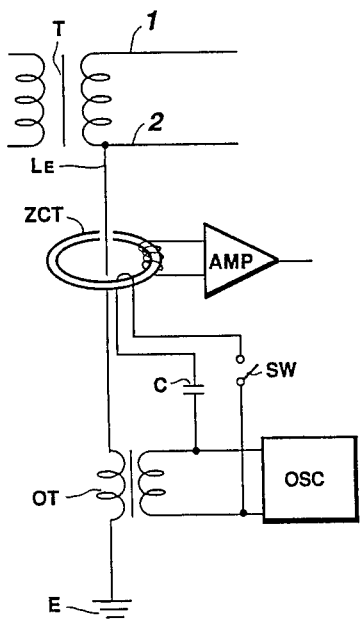
FIG.8(a)    FIG.8(b)    FIG.8(c)

METHOD FOR MEASURING INSULATION RESISTANCE OF ELECTRIC LINE

BACKGROUND OF THE INVENTION

1. Field of the Invention

The present invention relates to a method of compensating for a measurement error in an apparatus which measures the insulation resistance of an electric power transmission line, a grounding line for lightening protection or the like.

2. Description of the Related Art

There has been so far known in electric power transmission facilities such a measurement apparatus which monitors the insulation resistance between an electric line and the ground and detects the insulation deterioration of the line as fast as possible, thus preventing beforehand any trouble from occurring for the stable transmission of electric power. An example of such a measurement apparatus is given by an electric circuit in FIG. 1, which measures an insulation resistance $R_o$ between an electric line and the ground in the event where the electric power of a voltage stepped down by a transformer T is supplied or transmitted through electric lines 1 and 2 on of which is connected to the earth E through a grounding conductor $L_E$.

More specifically, the aforementioned circuit of FIG. 1 is arranged so that a transformer OT, which is connected to a low frequency signal oscillator OSC generating a measuring signal of a low frequency different from a commercial power source frequency, is inserted in the grounding line $L_E$ of the power receiving transformer T to apply a measuring low frequency voltage to the electric lines 1 and 2; a current transformer ZCT having the grounding line $L_E$ passed therethrough detects a leakage current of the aforementioned measuring low frequency signal that is fed back to the grounding conductor through the insulation resistance $R_o$ and an earth stray capacity $C_o$ existing between the electric lines and the earth; an amplifier AMP connected to the current transformer ZCT amplifies the detected leakage current; a filter FIL connected to the amplifier AMP extracts only a frequency $f_1$ component from the amplified signal; and a multiplier MULT synchronously detects the extracted component with use of, for example, an output signal of the oscillator OSC to detect an effective component ($OUT_1$) (that is, a component in phase with the applied low-frequency voltage) of the leakage current and to thereby measure the insulation resistance of the electric lines.

Explanation will next be made as to the measuring theory.

Assuming now that the measuring signal voltage applied to the grounding line $L_E$ is of a sine wave $V\sin\omega_1 t$ ($\omega_1 t = 2\pi f_1$), then a leakage current I of a frequency $f_1$ fed back to the grounding line $L_E$ through an earth point E is expressed by the following equation.

$$I = (V/R) \cdot \sin \omega_1 t + \omega_1 C_o V \cos \omega_1 t \quad (1)$$

The leakage current I extracted by the current transformer ZCT and passed through the amplifier AMP and the filter FIL is synchronously detected by the multiplier MULT with the signal of the oscillator OSC in phase with the low-frequency signal applied to the electric lines to extract its effective component, i.e., the first term in the right side of the above equation (1). The effective component, which is inversely proportional to the insulation resistance $R_o$, can be used to find the insulation resistance of the electric lines. With such a prior art method of detecting at the zero-phase current transformer ZCT the leakage current fed back to the grounding line and extracting and outputting at the filter FIL the component having a frequency of $f_1$ from the leakage current, however, when the leakage current component of the frequency $f_1$ is shifted in phase through passage of a system comprising the zero-phase current transformer ZCT, the amplifier AMP and the filter FIL, it becomes impossible to calculate the value of the insulation resistance accurately. To avoid this, it has been conventionally used a phase shifter which adjusts with respect to phase one or both of the signal sent to the multiplier MULT, i.e., the signal sent from the low frequency oscillator OSC and the leakage current passed through the extracting filter FIL from the current transformer ZCT to thereby set or correct a phase difference between the both signals to be zero.

However, the prior art method has been defective in that the phase characteristics of the current transformer ZCT, filter FIL, phase shifter and so on vary with temperature variations, the deterioration of characteristics of used parts with age and so on, which results in that a phase error from the initial adjustment value takes place, thus making it impossible to provide a correct measurement result. To cope with the defect, there has been so far employed such a high quality of zero-phase current transformer, filter and the like that are very small in their characteristic variations to thereby minimize the influence due to the phase error. Even so, it has been impossible to completely eliminate the influence.

More in detail, if the leakage current component I of the frequency $f_1$ shown in the equation (1) is assumed to have a phase shift $\theta$ when passed through the system of the zero-phase current transformer ZCT, amplifier AMP and filter FIL, then the filter FIL produces such an output I, as follows.

$$I_1 = (V/R_o) \sin(\omega_1 t + \theta) + \omega_1 C_o V \cos(\omega_1 t + \theta) \quad (2)$$

And the output $I_1$ is applied to a first input terminal of the multiplier MULT.

Assuming a voltage applied to a second input terminal of the multiplier is, for example, $a_o \sin(\omega_1 t + \theta)$ of a constant amplitude, then an output or an effective component D of the multiplier is expressed as follows.

$$D = \overline{I_1 \times a_o \sin(\omega_1 t + \theta_1)} \quad (3)$$

$$= (Va_o/2R_o)\cos(\theta - \theta_1) - (\omega_1 C_o V a_o/2)\sin(\theta - \theta_1) \quad (4)$$

where —— means to eliminate components of D above angular frequency $\omega_1$.

Hence. an output $D_o$ when $\theta = \theta_1$ is given as follows.

$$D_o = Va_o/2R_o \quad (5)$$

Since V and $a_o$ are constant, the output $D_o$ can be measured as a value inversely proportional to the insulation resistance $R_o$. Accordingly, an error E for the effective component D with respect to the output $D_o$ when the phase shift $(\theta - \theta_1)$ is not zero becomes:

$$E = (D_o - D)/D_o \qquad (6)$$
$$= 1 - \cos(\theta - \theta_1) - \omega_1 C_o R_o \sin(\theta - \theta_1)$$

For example, when $\theta - \theta_1 = 1$ degree, $R_o = 20 K\Omega$ and $C_o = 5\ \mu F$, $f_1 = 25$ Hz and $\omega_1 C_o R_o \cong 15.7$. This yields 27.4% of an error $\epsilon$ with a remarkably large measurement error.

It is an object of the present invention to provide a phase correcting method in an insulation resistance measuring apparatus, which eliminates the above defects in the prior art insulation resistance measuring method, and which can automatically correct a phase shift in a measurement signal inexpensively without the need for any expensive parts and can produce always a correct measurement result.

SUMMARY OF THE INVENTION

In accordance with the present invention, the above object is attained by providing a method of measureing an insuation resistance of electric lines in which an AC signal voltage having a frequency $f_1$ is applied to the electric line through a voltage transformer or a current transformer coupled to a grounding conductor or the electric lines, phase measuring currents having frequencies $(f_1 - f_s)$ and $(f_1 + f_s)$ are also applied to the electric line through a winding of the current transformer or voltage transformer, a leakage current component and the AC signal voltage are synchronously detected to obtain a synchronously detected output, the phase of the AC signal voltage of the frequency $f_1$ necessary for the synchronous detection is automatically adjusted so that a component of the synchronously detected output having a frequency $f_s$ becomes zero, whereby a phase shift caused by the respective devices of an insulation resistance measuring apparatus is corrected to compensate for the insulation resistance of the electric line.

Further, the signal flowing through the winding of the current or voltage transformer is shifted by a phase of 90 degrees to obtain a low frequency signal having the frequency $f_1$ and the low frequency signal is turned ON and OFF at intervals of repetitive frequency $f_s$ or the value of the low frequency signal is varied, the phase of the $f_1$ or $f_s$ signal is adjusted so that the amplitude of the component of the frequency $(f_1 + f_s)$ contained in the leakage current becomes equal to that of the component of the frequency $(f_1 - f_s)$ contained therein $(f_1 >> f_s)$, and the leakage current is synchronously detected to calculate the insulation resistance.

BRIEF DESCRIPTION OF THE DRAWINGS

FIGS. 7(a), 7(b) and 8(a), 8(b) and 8(c) show modifications of parts of the present invention, respectively.

DESCRIPTION OF THE PREFERRED EMBODIMENTS

Figure 2:
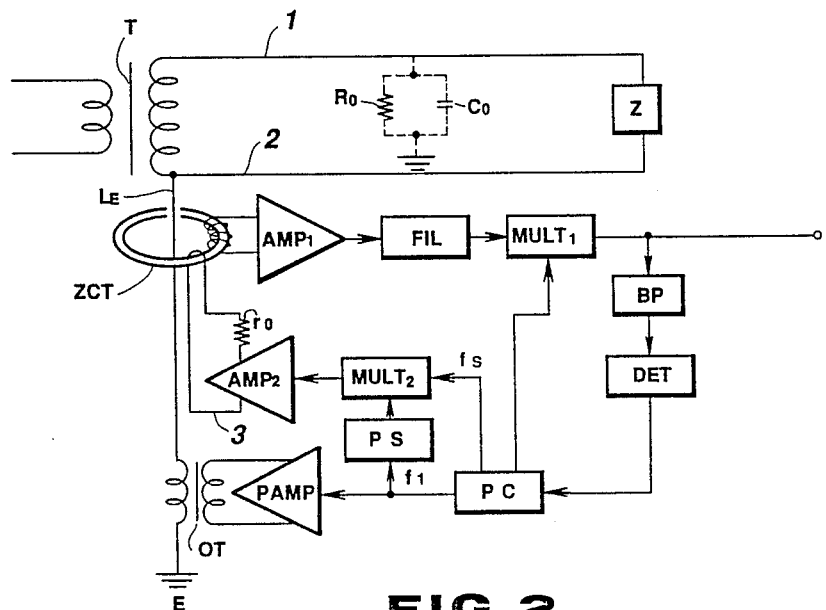
FIG. 2 is a block diagram showing a first embodiment of the present invention.

Referring first to FIG. 2, there is shown a circuit diagram of an embodiment of an insulation resistance measuring apparatus in accordance with the present invention, wherein reference symbol T denotes a voltage transformer and reference numerals 1 and 2 denote electric lines on the lower side of the transformer T respectively. Connected to the line 2 is an earthing conductor $L_E$ so as to meet the Japanese Regulations on the grounding works of grade 2. Connected and coupled to a voltage transformer OT and a current transformer ZCT respectively, one ZCT of which is connected at its output terminal through an amplifier $AMP_1$ and a filter FIL to one input terminal of a multiplier $MULT_1$ as a synchronous detector that in turn receives at the other input terminal an output of a phase control circuit PC. The multiplier $MULT_1$ and the other multipliers described hereafter are used as synchronous detectors for synchronous detection. The control circuit PC contains two signal oscillators for generating signals having frequencies $f_1$ and $f_s$ and a phase control unit. The low frequency signal $f_1$ is subjected to a predetermined phase shift and then applied through a power amplifier PAMP to the transformer OT. The current transformer ZCT has a signal line 3 coupled thereto, in which line a resistor $r_o$ and a second amplifier $AMP_2$ are wired in a loop form. The amplifier $AMP_2$ receives an output signal of a second multiplier $MULT_2$, which output signal corresponds to a product signal of the output signal $f_s$ of the phase control circuit PC and a signal obtained by shifting the phase of the signal $f_1$ (applied to the grounding conductor) by 90 degrees at 90° phase shifter PS. The phase control circuit PC is arranged so as to be controlled under a DC signal obtained by passing part of an output of the first multiplier $MULT_1$ through a band pass filter BP and a rectifier DET as a detector.

Figure 1:
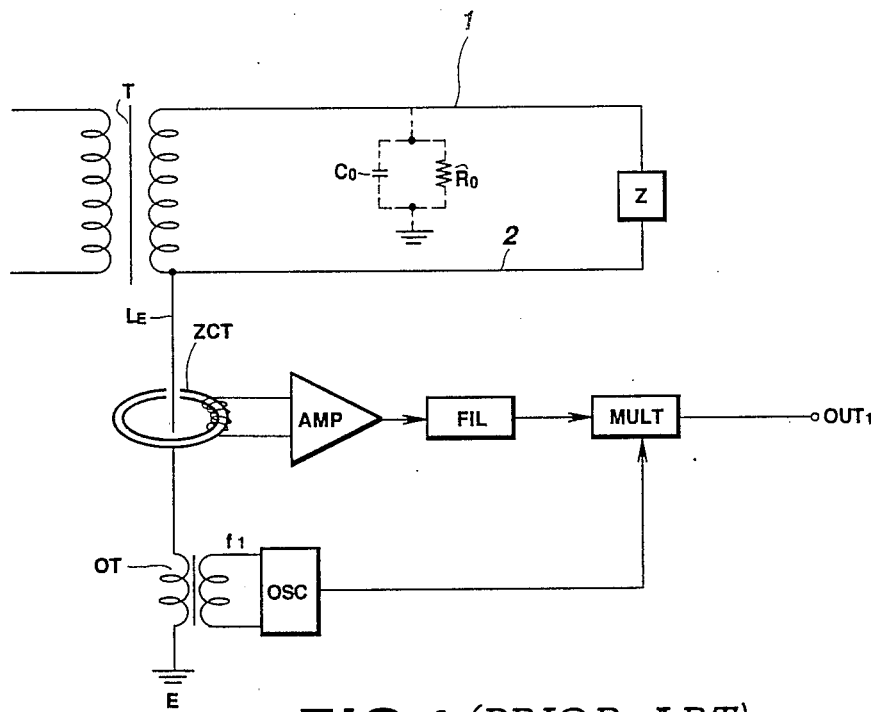
FIG. 1 is a block diagram showing a prior art insulation resistance measuring method.

The operations and functions of the respective elements and blocks of such a circuit as arranged as above will next be detailed with use of mathematical equations. The same blocks in FIG. 2 as those in FIG. 1 are operated in the same manner and thus explanation thereof is omitted.

The multiplier $MULT_2$, when receiving at its one input terminal the signal $a \cdot \cos \omega_s$ ($\omega_s = 2\pi f_s$) having the frequency $f_s$ from the phase control circuit PC and at the other input terminal the signal $e_o \cos \omega_1 t$ of the frequency $f_1$ sent from the phase control circuit PC through the 90° phase shifter PS, produces such an output e as expressed by the following equation.

$$e = a \cdot e_o \cos\omega_1 t \cdot \cos\omega_s t \qquad (7)$$
$$= a \cdot e_o [\cos(\omega_1 + \omega_s)t + \cos(\omega_1 - \omega_s)t]/2$$

Thus, a current I' flowing through the signal line 3 as the output of the amplifier AMP2 is expressed as follows.

$$I' = e/r_o \qquad (8)$$
$$= a \cdot e_o [\cos(\omega_1 + \omega_s)t + \cos(\omega_1 - \omega_s)t]/2r_o$$

Since the grounding conductor $L_E$, on the other hand, is subjected to an application of a voltage $V \sin \omega_1 t$ through the power amplifier PAMP and the transformer OT from the phase control circuit PC, the current transformer ZCT produces an output current which corresponds to a total $(I+I')$ of a leakage current component I expressed by the equation (2) and the current I' expressed by the equation (8) and applied through the signal line 3. When the output current $(I+I')$ of the current transformer ZCT is applied through the amplifier $AMP_1$ to the filter FIL, the filter FIL produces an output current $(I+I')$ subjected to a phase shift caused by the amplifier $AMP_1$ and the filter FIL. Putting $(I+I')=I_o$, then the output $I_o$ of the filter FIL is:

$$I_o = V \sin(\omega_1 t + \theta)/R_o + \omega_1 C_o V \cos(\omega_1 t + \theta) + a \cdot e_o [\cos\{(\omega_1 + \omega_s)t + \theta_1\} + \cos\{(\omega_1 - \omega_s)t + \theta_{-1}\}]/2r_o \quad (9)$$

where $\theta_1$ and $\theta_{-1}$ denote phase shifts caused by a system of the current transformer ZCT, amplifier $AMP_1$ and filter FIL at the frequencies $(f_1+f_s)$ and $(f_1-f_s)$, respectively. The multiplier $MULT_1$, when receiving at its one input terminal the output current $I_o$ of the filter FIL and at the other input terminal an AC voltage $a_o \sin(\omega_1 t + \theta')$ of the frequency $f_1$ as an output of the phase control circuit PC, generates an output D' which follows.

$$D' = \overline{I_o \times a_o \sin(\omega_1 t + \theta')} \quad (10)$$

(where symbol ——— represents components below the frequency $f_s$ and $\theta'$ represents a phase shift for phase compensation.)

$$\begin{aligned}
&= a_o V \{\cos(\theta - \theta')/R - \omega_1 C \sin(\theta - \theta')\}/2 \\
&\quad - a e_o a_o \{\sin(-\omega_s t + \theta_{-1} - \theta')\}/4 \\
&\quad \sin(\omega_s t + \theta_{-1} - \theta')\}/4 \\
&= a_o V \{\cos(\theta - \theta')/R - \omega_1 C \sin(\theta - \theta')\}/2 \\
&\quad - a e_o a_o [\sin\{(\theta_{-1} + \theta')/2 - \theta'\} \cdot \\
&\quad \cos\{(\omega_s t + (\theta_1 - \theta_{-1})/2\}]/2
\end{aligned} \quad (11)$$

Suppose that $\omega_s << \omega_1$. Then, $$(\theta_{-1} + \theta_1)/2 \cong \theta \quad (12)$$

Substituting the equation (12) into the equation (11) results in:

$$D' = a_o V \{\cos(\theta - \theta')/R - \omega_1 C \sin(\theta - \theta')\}/2 - a e_o a_o [\sin(\theta - \theta') \cos\{\omega_s t + (\theta_1 - \theta_{-1})/2\}]/2 \quad (13)$$

when $\theta = \theta'$ in the equation (13), the frequency $f_s$ component of the second term of the equation (13) becomes zero and the DC component of the synchronous detector output D' expressed by the first term thereof is written as follows.

$$a_o V \{\cos(\theta - \theta')/R - \omega_1 C \sin(\theta - \theta')\}/2 \to a_o V/2R \quad (14)$$

Thus, it will be understood that the insulation resistance of the electric line can be measured independently of the phase difference. That is, the frequency $f_s$ component of the output D' of the synchronous detector $MULT_1$ is detected at the filter BP, the detected $F_s$ component is rectified at the rectifier DET and applied to the phase control circuit PC so that the circuit PC automatically adjusts a phase shift $\theta'$ for the compensation of the phase of the voltage $a_o \sin(\omega_1 t + \theta')$ applied from the circuit PC to the multiplier $MULT_1$ so that the DC component of the output of the rectifier DET becomes zero; whereby the insulation resistance of the electric line can be measured regardless of the influence of the phase shift $\theta$.

Figure 3:
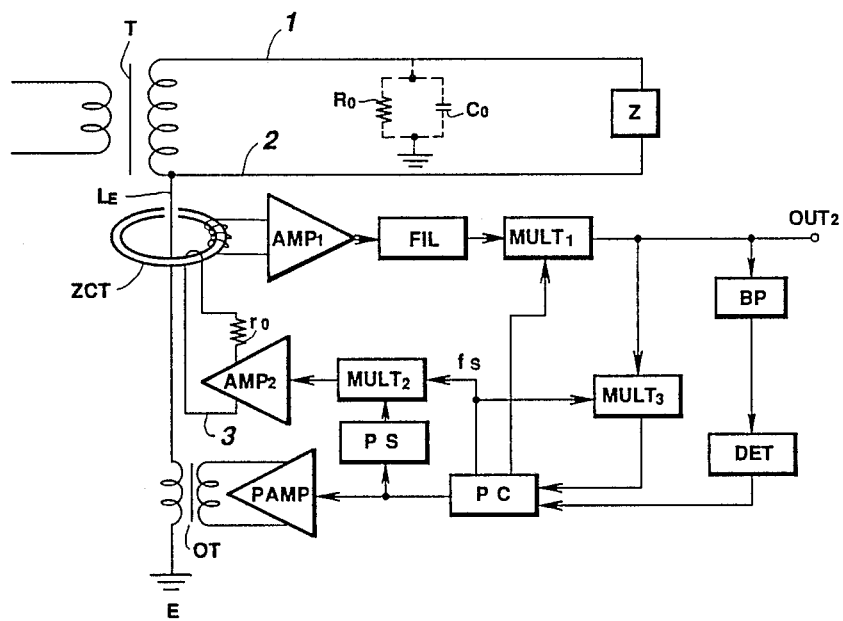
FIG. 3 is a block diagram showing a modification of the first embodiment.

As shown in FIG. 3, when the output D' of the multiplier $MULT_1$ as well as a voltage $a \cdot \cos \omega_s t$ of the signal $f_s$ applied to one input terminal of the multiplier $MULT_2$ from the phase control circuit PC are applied to respective input terminals of a third multiplier $MULT_3$ respectively, an output D'' of the multiplier $MULT_3$ is expressed as follows.

$$D'' = D' \times a \cdot \cos \omega_s t$$

$$D'' = a_o a V \{\cos(\theta - \theta')/R - \omega_1 C \sin(\theta - \theta')\} \cdot \cos \omega_s t/4 - \{a^2 e_o a_o \sin(\theta - \theta')/4\} \cdot [\cos\{(2\omega_s t + (\theta_1 - \theta_{-1})/2\} + \cos(\theta_1 - \theta_{-1})/2]$$

And the DC component $d_o$ of the output D'' is:

$$d_o = -\{a^2 e_o a_o \sin(\theta - \theta')/4\} \cdot \{\cos(\theta_1 - \theta_{-1})/2\}$$

If $\omega_s << \omega_1$, then $\cos((\theta_1 - \theta_{-1})/2) \cong 1$. Hence, $d_o < 0$ for $\theta > \theta'$ and $d_o > 0$ for $\theta < \theta'$ and thus the measurement of the DC component $d_o$ also enables the discrimination of the control direction of the phase $\theta$.

Figure 4:
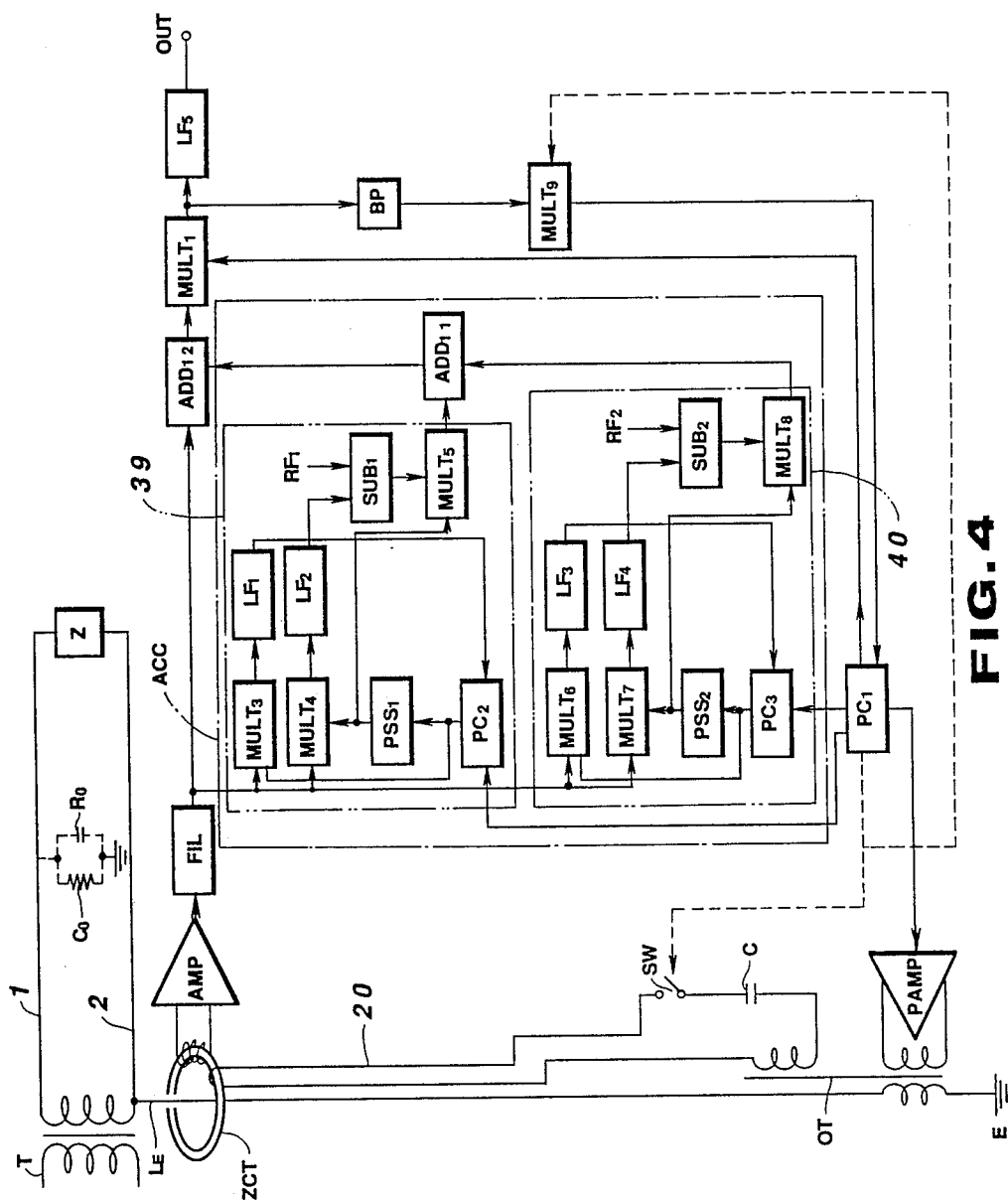
FIG. 4 is a block diagram showing a second embodiment of the present invention.

The present invention may be further modified as shown in FIG. 4. That is, FIG. 4 shows a block diagram of another embodiment embodying the insulation resistance measuring method in accordance with the present invention, wherein reference symbol T denotes a voltage transformer and reference numerals 1 and 2 denote electric lines on the secondary side of the transformer T respectively. Connected to the electric line 2 is a grounding conductor $L_E$ so as to meet the Japanese Regulations on grounding works of grade 2. Coupled and connected to the grounding conductor $L_E$ are a secondary winding $N_2$ of a transformer OT and a current transformer ZCT. Applied to a primary winding $N_1$ of the transformer OTs is an output of a phase control circuit $PC_1$ through a power amplifier PAMP. In the illustrated example, the current transformer ZCT has a signal line 20 connected in a loop form to a tertiary winding $N_3$ of the transformer OT through a capacitor C and a switch SW. The ON and OFF operations of the switch SW are controlled by a signal of a frequency $f_s$ corresponding to an output of the phase control circuit $PC_1$. The power amplifier PAMP receives as its input signal another output of the phase control circuit $PC_1$. The impedance of the secondary winding of the transformer OT is as sufficiently low at a commercial frequency as not prevents the grounding function of the electric line.

An output of the current transformer ZCT, on the other hand, is sent to one input terminal of an adder $ADD_{12}$ through an amplifier AMP and a filter FIL for removal of the commercial frequency component. The adder $ADD_{12}$ also receives at the other input terminal an output of an amplitude correction circuit ACC. The circuit ACC comprises first and second correction-signal generating units 39 and 40 and an adder/amplifier $ADD_{11}$. The generating units 39 and 40 have substantially the same arrangement. The generating unit 39 will first be explained in detail. The generating unit 39 has a second phase control circuit $PC_2$ connected to the phase control circuit $PC_1$. The second phase control circuit $PC_2$ applies its output to a 90° phase shifter $PSS_1$ and also to a third multiplier $MULT_3$. An output of the phase shifter $PSS_1$ to one input terminals of fourth and fifth multipliers $MULT_4$ and $MULT_5$ respectively.

The multipliers MULT$_3$ and MULT$_4$ receive at their other input terminals the output of the filter FIL. The multiplier MULT$_3$ applies its output to the phase control circuit PC$_2$ through a low pass filter LF$_1$, while the multiplier MULT$_4$ applies its output to one input terminal of a subtractor SUB$_1$ through a low pass filter LF$_2$. The subtractor SUB$_1$ also receives at the other input terminal a reference value signal RF$_1$ and applies its output to the other input terminal of the multiplier MULT$_5$.

The second correction-signal generating unit 40, like the first one 39, comprises a phase control circuit PC$_3$, a 90° phase shifter PSS$_2$, multipliers MULT$_6$ and MULT$_7$, low pass filters LF$_3$ and LF$_4$, a subtractor SUB$_2$ and a multiplier MULT$_8$. These elements are connected in substantially the same manner as those in the generating unit 39 and the subtractor SUB$_2$ receives at its one input terminal a reference value signal RF$_2$.

Outputs of the multipliers MULT$_5$ and MULT$_8$ in the two units 39 and 40 arranged as mentioned above are applied to an adder/amplifier ADD$_{11}$ which in turn supplies its output to the other input terminal of an adder ADD$_{12}$. An output of the adder ADD$_{12}$ is applied to one input terminal of the multiplier MULT$_1$ which also receives at the other input terminal an output of the phase control circuit PC$_1$.

At this time, an output of the multiplier MULT$_1$ is supplied to a low pass filter LF$_5$ to be output as a measured insulation-resistance value therefrom. The output of the multiplier MULT$_1$ is also sent to the phase control circuit PC$_1$ through a band pass filter BP and a ninth multiplier MULT$_9$. The multiplier MULT$_9$ also receives at the other input terminal the ON/OFF signal (for controlling the switch SW) as the output of the phase control circuit PC$_1$.

The operations and functions of the respective elements and blocks of the circuit arranged as explained above will next be detailed by means of mathematical equations.

Assuming that a measuring low-frequency signal voltage V of a frequency $f_1$ appears in the winding N$_2$ of the transformer OT, then the filter FIL outputs such a leakage current $I_1$ of the frequency $f_1$ as expressed by the following equation (15).

$$I_1 = (V/R_o)\cdot\sin(\omega_1 t + \theta) + \omega_1 C_o V \sin(\omega_1 t + \theta) \quad (15)$$

When an output voltage $V_o \sin \omega_1 t$ appears in the winding N$_3$ of the transformer OT and the switch SW having a duty of 50% is turned ON and OFF at intervals of a period $1/f_s$, a current i flows through the signal line 20 as follows.

$$i = \omega_1 C V_o \{\cos \omega_1 t/2 + \cos(\omega_1-\omega_s)t/\pi + \cos(\omega_1+\omega_s)t/\pi - \cos(\omega_1-3\omega_s)t/3\pi - \cos(\omega_1+3\omega_s)t/3\pi + \ldots \} \quad (16)$$

This is the same when a carrier signal $\cos \omega_1 t$ is 100% amplitude-modulated with an ON/OFF data of the period $1/f_s$ (refer to a book entitled 'Data Transmission', William R. Bennet, James R. Davie, p. 38, published from Lattice Company).

Figure 5:
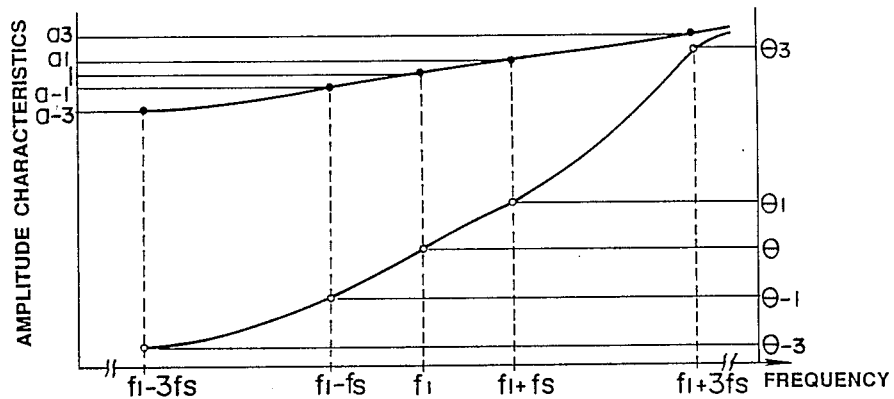
FIG. 5 is a graph for determining constants used in calculation equations in the second embbodiment.

Accordingly, the current i flowing through the signal line 20 and the leakage current flowing through the grounding conductor L$_E$ becomes a primary current of the current transformer ZCT, so that the output I$_2$ of the filter FIL is as shown by the following equation (17), according to the equations (15) and (16).

$$\begin{aligned}I_2 = &\ (V/R_o)\cdot\sin(\omega_1 t + \theta) + \omega_1 C_o V\cos(\omega_1 t + \theta) + \\ &\ \omega_1 C V_o [\cos(\omega_1 t + \theta)/2 + a_{-1}\cos\{(\omega_1 - \omega_s)t + \\ &\ \theta_{-1}\}/\pi + a_1\cos\{(\omega_1 + \omega_s)t + \theta_1\}/\pi - \\ &\ a_{-3}\cos\{(\omega_1 - 3\omega_s)t + \theta_{-3}\}/3\pi - \\ &\ a_3\cos\{(\omega_1 + 3\omega_1 + 3\omega_s)t + \theta_3\}/3\pi + \ldots]\end{aligned} \quad (17)$$

where $a_{-1}$, $a_1$, $a_3$, $a_3$ and so on denote amplitude characteristics of such a system of the current transformer ZCT, amplifier AMP and filter FIL as shown in FIG. 5 at frequencies of $(f_1-f_s)$, $(f_1+f_s)$, $(f_1-3f_s)$, $(f_1-3f_s)$ ... respectively, (in which case, however, the amplitude characteristic at the frequency $f_1$ is set to be 1 for the sake of easy explanation). Further, $\theta$, $\theta_{-1}$, $\theta_1$, $\theta_{-3}$, $\theta_3$, ... denote phase characteristics of the same system of FIG. 5 at the same frequencies, respectively.

For the convenience of easy explanation, the amplitude correction circuit ACC will be explained later and explanation will first be made as to the case where an input signal 15 at one input terminal of the adder ADD$_{12}$ sent from the amplitude correction circuit ACC is absent. In this case, the synchronous detector MULT$_1$, when receiving at its one input terminal the current $I_2$ of the equation (17) and at the other input terminal a signal voltage $\sin(\omega_1 t + \theta')$ (in the illustrated example, which amplitude is set to be 1 for the convenience of easy explanation) of the phase $f_1$ and phase $\theta'$ from the phase control circuit PC$_1$, will produce the following output X.

$$X = \overline{I_2 \times \sin(\omega_1 t + \theta')} \quad (18)$$

(where —— indicates to remove components above $\omega = \omega_1$). Substituting the equation (17) into the equation (18) and rearranging it give:

$$\begin{aligned}X = &\ \{(V/R_o)\cdot\cos(\theta - \theta') - \\ &\ \omega_t(C_o V + C V_o/2)\sin(\theta - \theta')\}/2 - \\ &\ (\omega_1 C V_o/2\pi)\cdot\{a_{-1}\sin(-\omega_s t + \theta_{-1} - \theta') + \\ &\ a_1\sin(\omega_s t + \theta_1 - \theta')\} + \\ &\ (\omega_1 C V_o/6\pi)\cdot\{a_{-3}\sin(-3\omega_s t + \\ &\ \theta_{-3} - \theta') + a_3\sin(3\omega_s t + \theta_3 - \theta')\}\end{aligned} \quad (19)$$

From the equation (19), the component X ($\omega = \omega_s$) of the output of the multiplier MULT$_1$ having a frequency $f = f_s$ is expressed as follows.

$$X(\omega = \omega_x) = -(\omega_1 C V_o/2\pi)\cdot\{a_{-1}\sin(-\omega_s t + \theta_{-1} - \theta') + a_1\sin(\omega_s t + \theta_1 - \theta')\} \quad (20)$$

Hence, assuming that the phase characteristic of the filter BP is $\phi$, then an output X$_o$ of the filter BP for detecting the frequency $f_s$ component is expressed by:

$$X_o = (\omega_1 C V_o/2\pi)\cdot\{a_{-1}\sin(\omega_s t - \theta_{-1} + \theta' + \phi) - a_1\sin(\omega_s t + \theta_1 - \theta' + \phi)\} \quad (21)$$

When the output X$_o$ of the filter BP is synchronously detected at the ninth multiplier MULT$_9$ with use of the signal acting to turn ON and OFF the switch SW, the multiplier MULT$_9$ produces an output D$_1$ which follows.

$$D_1 = \overline{X_o \times \cos \omega_s t}$$

(where ─── means to remove components above $\omega = \omega_s$)

$$= (\omega_1 CV_o/4\pi) \cdot \{a_{-1}\sin(\theta' - \theta_{-1} + \theta) - a_1\sin(\theta_1 - \theta' + \phi)\} \quad (22)$$

Substituting the following equation (23) into the equation (22) results in that $D_1$ is rewritten as follows.

$$\left. \begin{array}{l} \theta - \theta' = \alpha \\ \theta_1 - \theta = \epsilon_1 \\ \theta - \theta_{-1} = \epsilon_2 \end{array} \right\} \quad 23$$

$$D_1 = (\omega_1 CV_o/4\pi) \cdot \{a_{-1}\sin(\epsilon_2 + \phi - \alpha) - a_1\sin(\epsilon_1 + \phi + \alpha)\} \quad 24$$

$$= a_{-1}\{\sin(\epsilon_2 + \phi)\cos\alpha - \cos(\epsilon_2 + \phi)\sin\alpha\} \quad (25)$$
$$- a_1\{\sin(\epsilon_1 + \phi)\cos\alpha + \cos(\epsilon_1 + \phi)\cos\alpha\}$$

If $|\alpha| << 1$ for $D_1 \to 0$, then the following relation is satisfied according to the equation (25).

$$a_{-1}\{\sin(\epsilon_2+\phi)-\cos(\epsilon_2+\phi)\cdot\alpha-a_1\{\sin(\epsilon_1+\phi)+\cos(\epsilon_1+\phi)\cdot\alpha\}=0$$

Hence, $\alpha$ is written as follows.

$$\begin{aligned} \alpha &= \{a_{-1}\sin(\epsilon_2 + \phi) - a_1\sin(\epsilon_1 + \phi)\}/ \\ & \quad \{a_1\cos(\epsilon_1 + \phi) + a_{-1}\cos(\epsilon_2 + \phi)\}/ \\ &= \{\tau \sin(\epsilon_2 + \phi) - \sin(\epsilon_1 + \phi)\}/ \\ & \quad \{\cos(\epsilon_1 + \phi) + \tau \cos(\epsilon_2 + \phi)\} \end{aligned} \quad (26)$$

where $\tau = a_{-1}/a_1$ \quad (27)

Accordingly, when $\tau \to 1$ the equation (26) is rewritten as follows.

$$\alpha(\tau=1)=\tan(\epsilon_2-\epsilon_1)/2 \quad (28)$$

Therefore, $\alpha$ becomes independent of the phase $\phi$ of the output of the filter BP. If $\epsilon_2 = \epsilon_1$, i.e., if the phase characteristic is a complete odd function with respect to the frequency $f_1$, then $\alpha = 0$ and thus $\theta = \theta'$ from the equation (23). Since the substitution of it into the equation (19) results in that the DC component (corresponding to an output OUT$_2$ of the low pass filter LF$_5$) of the output of the multiplier MULT$_1$ becomes $V/2R_o$. As a result, the insulation resistance can be measurely correctly.

As has been explained in the foregoing, the frequency $f_s$ component of the output of the multiplier MULT$_1$ is synchronously detected at the multiplier MULT$_9$ with use of the frequency $f_s$ signal acting to turn ON and OFF the switch SW, and the phase control circuit PC$_1$ automatically adjusts the phase of the frequency $f_1$ signal applied to the multiplier MULT$_1$ so that the output of the multiplier MULT$_9$ becomes zero.

Explanation will next be directed to the operation of the amplitude correction circuit ACC. The circuit ACC has a function of satisfying the equation (28) ($\tau = 1$), i.e., of making equal the amplitude of the frequency $(f_1-f_s)$ component $a_1$ of the output of the filter FIL to that of the fequency $(f_1+f_s)$ component $a_1$ thereof.

Assuming in the amplitude correction circuit ACC that a signal voltage $\sin\{(\omega_1-\omega_s)t+\theta''\}$ having a frequency of $(f_1-f_s)$, a phase of $\theta''$ and an amplitude of 1 is applied to one input terminal of the multiplier MULT$_3$ for the convenience of explanation, then the multiplier MULT$_3$ receiving at the other input terminal the output of the filter FIL, i.e., the current $I_2$ corresponding to the equation (17) will send its output to the low pass filter LF$_1$ to obtain as an output of the filter LF$_1$ the following DC component $d_{s-1}$.

$$d_{s-1}=\overline{I_2 \times \sin\{(\omega_1-\omega_s)t+\theta''\}}$$

(where ─── indicates the DC component.) Substituting the equation (17) into the above equation and rearranging it gives the following equation (29).

$$=(\omega_1 CV_o a_{-1}/2\pi)\cdot\sin(\theta''-\theta_{-1}) \quad (29)$$

The 90° phase shifter PSS$_1$ generates an output signal $\cos\{(\omega_1-\omega_s)t+\theta''\}$ and thus a DC component $d_{c-1}$ obtained by passing the output of the multiplier MULT$_4$ through the low pass filter LF$_2$ is:

$$d_{c-1}=\overline{I_2 \times \cos\{(\omega_1-\omega_s)t+\theta''\}}$$

(where ─── means the DC component.)

$$=(\omega_1 CV_o a_{-1}/2\pi)\cdot\cos(\theta''-\theta_{-1}) \quad (30)$$

Thus, when the phase control circuit PC$_2$ receiving the output $d_{s-1}$ of the filter LF$_1$ automatically adjusts the phase $\theta''$ so that $d_{s-1}$ becomes zero, a relation $\theta'' \cong \theta$, with the result that the output $d_{c-1}$ of the low pass filter LF$_2$ is expressed by $(\omega_1 CV_o a_{-1}/2\pi)$. At this time, the output of the 90° phase shifter PSS$_1$ becomes $\cos\{(\omega_1-\omega_s)t+\theta_{-1}\}$. The subtractor SUB$_1$, when receiving the output of the low pass filter LF$_2$ and a reference value $RF_1=(\omega_1 CV_o/2\pi)$, will produce such an output SUB$_1$ as expressed by $(\omega_1 CV_o/2\pi)\cdot(1-a_{-1})$. The multiplier MULT$_5$, when receiving the output of the subtractor SUB$_1$ and the output of the 90° phase shifter PSS$_1$ and calculating a product of these outputs, will produce such an output as expressed by $(\omega_1 CV_o/2\pi)\cdot(1-a_{-1})\cdot\cos\{(\omega_1-\omega_s)t+\theta_{-1}\}$ which output is then applied to one input terminal of the adder/amplifier ADD$_{11}$ (having a grain of 2).

Similarly, the multiplier MULT$_6$ already receiving at the other input terminal the current $I_2$ corresponding to the equation (17), when receiving at its one input terminal a voltage signal $\sin\{(\omega_1+\omega_s)t+\theta'''\}$ having a frequency of $(f_1+f_s)$, a phase of $\theta'''$ and an amplitude of 1 for the sake of easy explanation from the phase control circuit PC$_3$, the multiplier MULT$_6$ will produce an output that is sent to the low pass filter LF$_3$. Then the DC component output of the filter LF$_4$ is expressed as follows.

$$d_{s1}=\overline{I_2 \times \sin\{(\omega_1+\omega_s)t+\theta'''\}}$$

(where ─── means the DC component.) Substituting the equation (17) into the above equation and rearranging it gives:

$$=(\omega_1 CV_o a_1/2\pi)\cdot\sin(\theta'''-\theta_1) \quad (31)$$

Since the output of the 90° phase shifter PSS$_2$ is expressed by $\cos\{(\omega_1+\omega_s)t+\theta\theta''\}$, a DC component $d_{c1}$ obtained by passing the output of the 90° phase shifter PSS$_2$ through the multiplier MULT$_7$ and the low pass filter LF$_4$ is:

$$d_{c1} = \overline{I_2 \times \cos\{(\omega_1+\omega_s)t+\theta''\}}$$

(where —— means the DC component.)

$$= (\omega_1 CV_o a_1/2\pi)\cdot\cos(\theta''-\theta_1) \quad (32)$$

When the output $d_{si}$ is applied to the phase control circuit PC$_3$ and the circuit PC$_3$ automatically adjusts the phase $\theta''$ so that the output $d_{si}$ becomes zero, the equation (31) is rewritten as follows.

$$d_{s1} = (\omega_1 CV_o a_1/2\pi)$$

Thus, the then output of the 90° phase shifter PSS$_2$ is expressed by $\cos\{(\omega_1+\omega_s)t+\theta_1\}$. The subtractor SUB$_2$, when receiving at its one input terminal the output $d_{c1}$ of the low pass filter LF$_4$ and at the other input terminals a reference value RF$_2 = (\omega_1 CV_o/2\pi)$, will produce such an output expressed by $(\omega_1 CV_o/2\pi)\cdot(1-a_1)$. The application of the output of the subtractor SUB$_2$ and the output of the PSS$_2$ to the multiplier MULT$_8$ causes the multiplier MULT$_8$ to generate such an output as written by $(\omega_1 CV_o/2\pi)\cdot(1-a_1)\cdot\cos\{(\omega_1+\omega_s)t+\theta_1\}$. The adder/amplifier ADD$_{11}$ (having a gain of 2), when receiving at the other input terminal the output of the multiplier MULT$_8$, will generate an output $i_1$, which follows.

$$i_p = (\omega_1 CV_o/\pi)\cdot(1-a_{-1})\cdot\cos\{(\omega_1-\omega_s)t+\theta_{-1}\} + (\omega_1 CV_o/\pi)\cdot(1-a_{1l})\cdot\cos\{(\omega_1+\omega_s)t+\theta_1\} \quad (33)$$

When the output $i_p$ of the adder/amplifier ADD$_{11}$ as well as the output $I_2$ of the filter FIL are applied to the adder ADD$_{12}$, the adder ADD$_{12}$ produces such an output as shown below, according to the equations (17) and (33).

$$I_2 + i_p = (V/R_o)\cdot\sin(\omega_1 t+\theta) + \omega_1 CV\cos(\omega_1 t+\theta) + \omega_1 CV_o[\cos(\omega_1 t+\theta)/2 + \cos\{(\omega_1-\omega_s)t+\theta_{-1}\}/\pi - a_{-3}\cdot\cos\{(\omega_1-3\omega_s)t+\theta_{-3}\}/3\pi - a_3\cdot\cos\{(\omega_1+3\omega_s)t+\theta_3\}/3\pi + \ldots] \quad (34)$$

Thus, the amplitude of the component of the frequency $(f_1+f_s)$ contained in the output of the adder ADD$_{12}$ becomes equal to that of the component of the frequency $(f_1-f_s)$ contained in the same output, and this corresponds to the case where $\tau=1$ in the equation (27).

That is, since the amplitude is corrected and the output $D_1$ of the equation (22) becomes close to zero, $(\theta-\theta')$ becomes closer to zero, whereby the insulation resistance can be measured correctly.

Figure 6:
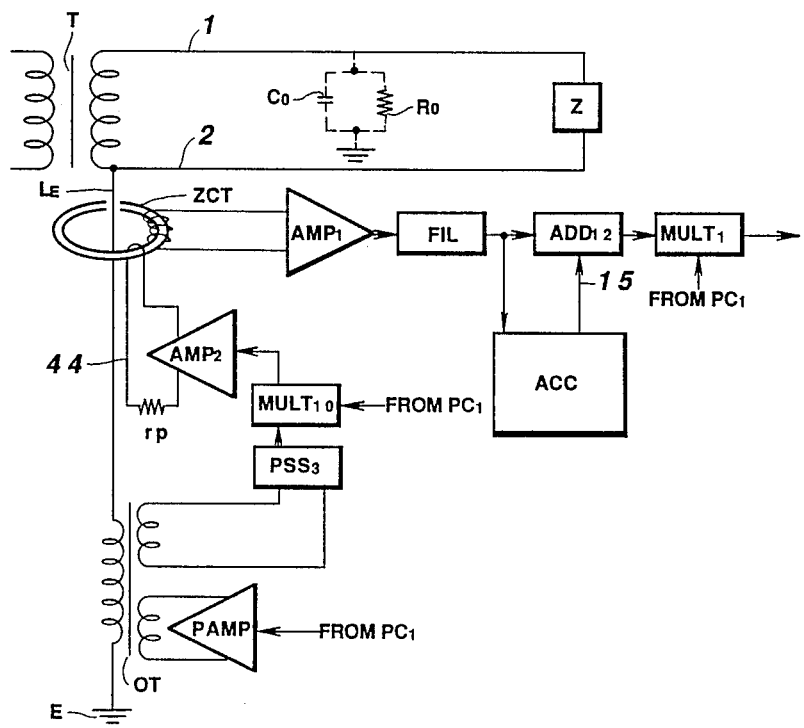
FIG. 6 shows a modification of a part of the second embodiment.

Although the voltage $V_o \sin\omega_1 t$ has been applied to the capacitor C and the current $\omega_1 CV_o \cos\omega_1 t$ has been turned ON and OFF at intervals of the frequency $f_s$ in order to generate the components having the frequencies $(f_1-f_s)$ and $((f_1+f_s)$ in the foregoing explanation, the present invention is not limited to the particular example but may be modified as shown in FIG. 6. In the latter case, the output of a winding N$_3$ of a transformer OT is applied to a 90° phase shifter PSS$_3$ to obtain an output $V_o \cos\omega_1 t$ of the phase shifter PSS$_3$, and the output $V_o \cos\omega_1 t$ is applied to one input terminal of a multiplier MULT$_{10}$ which receives at the other input terminal the output, for example, $e_o \cos\omega_s t$, of a phase control circuit PC$_1$, so that the multiplier MULT$_{10}$ produces such an output signal as given below.

$$V_o \cos\omega_1 t\cdot e_o \cos\omega_s t = (Ve_o/2)\cdot[\cos(\omega_1+\omega_s)t+\cos(\omega_1-\omega_s)t]$$

The output signal of the multiplier MULT$_{10}$ is applied to an amplifier AMP$_2$ which in turn sends its output through a resistor $r_p$ to a signal line 44 of a transformer ZCT. As a result, such a current $i'$ as expressed below flows through the signal line 44.

$$i' = (Ve_o/2rp)\cdot\{\cos(\omega_1+\omega_s)t+\cos(\omega_1-\omega_s)t \quad (35)$$

Thus, a filter FIL produces a corresponding output $I_2'$ which follows.

$$I_2' = (V/R_o)\cdot\sin(\omega_1 t+\theta)+\omega_1 C_o V\cos(\omega_1 t+\theta)+(Ve_o/2rp)\cdot[a_1 \cos\{(\omega_1+\omega_s)t+\theta_1\}+a_{-1}\cos\{(\omega_1-\omega_s)t+\theta_{-1}\}] \quad (36)$$

This current $I_2'$ does not contain such harmonic components as $(\omega_1 \pm 3\omega_s)$, $(\omega_1 \pm 5\omega_s)$ and so on. Further, in this case, an output $X'$ of a multiplier MULT$_1$ is expressed as follows.

$$X' = \{(V/R_o)\cdot\cos(\theta-\theta')-\omega_1 CV_o\sin(\theta-\theta')\}/2-(Ve_o/4rp)\cdot\{a_{-1}\sin(-\omega_s t+\theta_{-1}-\theta')+a_1\sin(\omega_s t+\theta_1-\theta')\} \quad (37)$$

An output $X_o'$ of a filter BP is:

$$X_o' = (Ve_o/4rp)\cdot\{a_{-1}\sin(\omega_s t-\theta_{-1}+\theta'+\phi)-a_1\sin(\omega_s t+\theta_1-\theta'+\phi)\} \quad (38)$$

As will be clear from the equation (22), the condition satisfying $D_1=0$ is the same for each of the equations (22) and (23). Accordingly, how the phase control circuit PC$_1$ adjusts the phase for the multiplier MULT$_1$ and the operation of an amplitude correction circuit 30 are substantially the same as those in the foregoing embodiment.

If the amplitude characteristic of a system of the current transformer ZCT, amplifier AMP and filter FIL is completely flat and $\tau$ expressed by the equation (27) is 1, then the amplitude correction circuit ACC will become unnecessary. However, the complete flatening of the amplitude characteristic uneconomically requires such a circuit as uses a high grade of technique.

It is desirable that the embodiment of FIG. 4 is realized as required with use of morden digital processing techniques. Further, though the present invention has been applied to the single-phase, 2-wire electric line in the foregoing embodiments, the invention may also be applied to single-phase, 3-wire electric line and 3-phase, 3-wire electric line. In addition, deterioration in the insulation resistance of a load Z with respect to the earth may be measured.

The current transformer has been coupled to the grounding conductor in the foregoing embodiments, but the present invention is not restricted to the particular example but the current transformeer may be coupled to both the electric lines 1 and 2 in FIG. 4 and further to the signal line 20, as will be appreciated.

Although the phase of the signal applied to the second input terminal of the synchronous detector has been adjusted for the purpose of the phase adjustment in the foregoing embodms, it will be appreciated that the same effect can be obtained by adjusting the phase of the output signal of the filter FIL applied to the first input terminal of the synchronous detector.

The currents of the frequencies $(f_1+f_s)$ and $(f_1-f_s)$ flowing through the signal line have been prepared on the basis of the signal obtained by calculating a product of the voltage signals $a \cdot \cos \omega_s t$ and $e_o \sin \omega_1 t$, but the present invention is not limited to the particular example and it is clear that such currents may be prepared by providing clock generators within the phase control circuit.

Though the current transformer and transformer have been coupled to the grounding conductor for the purpose of applying the measuring signal and extracting the leakage current, the present invention is not restricted to the particular example and the current transformer may be coupled drectly to the electric lines as shown, for example, in FIGS. 7(a) and 7(b).

The means of connecting the signal line for the purpose of causing the signals $(f_1 \pm f_s)$ to act on the leakage current extracting means may be modified as shown in FIGS. 8(a), 8(b) and 8(c).

As has been disclosed in the foregoing, in accordance with the present invention, automatic phase adjustment can be realized with respect to variations in the phase characteristics of an insulation resistance measuring circuit and thus a highly stable measuring method can be advantageously realized with remarkable effects.

What is claimed is:

1. A method of measuring an insulation resistance of an electric line, in which a low frequency signal having a frequency $f_1$ different from a commercial frequency is applied to said electric line through a first transformer coupled to a grounding conductor of a voltage transformer of the electric line or to the electric line, and a leakage current component of said low frequency signal fed back to said grounding conductor is applied to a first input of synchronous detecting means to measure said insulation resistance between the electric line and the earth; said method comprising the steps of:
   branching said low frequency signal:
   adding and subtracting a signal having a frequency $f_s$ to and from a branched low frequency signal to form signals having frequencies $(f_1+f_s)$ and $(f_1-f_s)$;
   causing $(f_1+f_s)$ frequency signals to act on leakage current component extracting means;
   synchronously detecting said leakage current component with the $f_1$ and $f_s$ frequencies to obtain a synchronous detection signal; and
   controlling a phase of a signal applied to a second input of said synchronous detecting means so that a component of said synchronous detection signal having the frequency $f_s$ becomes minimum.

2. A method of measuring an insulation resistance of an electric line, in which a low frequency signal having a frequency $f_1$ different from a commercial frequency is applied to said electric line through a first transformer coupled to a grounding conductor of a voltage transformer of the electric line or to the electric line, a leakage current component of said low frequency signal fed back to said grounding conductor is applied to a first input of synchronous detecting means to obtain a synchronous detection signal, and said synchronous detection signal is used to measure said insulation resistance between the electric line and the earth; said method comprising the steps of:
   branching said low frequency signal;
   changing with a frequency $f_s$ a current value of said branched low frequency signal shifted by 90 degrees;
   causing said frequency-changed current to act on leakage current component extracting means; and
   controlling a phase of a signal applied to a second input of said synchronous detecting means so that a component of said synchronous detection signal having the frequency $f_s$ becomes minimum.

* * * * *